United States Patent
Chaji (10) Patent No.: US 11,948,503 B2
(45) Date of Patent: Apr. 2, 2024

(54) DISPLAY OPTIMIZATION TECHNIQUES FOR MICRO-LED DEVICES AND ARRAYS

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 18/178,157

(22) Filed: Mar. 3, 2023

(65) Prior Publication Data

US 2023/0206829 A1 Jun. 29, 2023

Related U.S. Application Data

(63) Continuation of application No. 17/494,399, filed on Oct. 5, 2021, now Pat. No. 11,610,535, which is a continuation of application No. 17/015,024, filed on Sep. 8, 2020, now Pat. No. 11,164,512, which is a continuation of application No. 16/126,444, filed on Sep. 10, 2018, now abandoned.

(60) Provisional application No. 62/556,608, filed on Sep. 11, 2017.

(51) Int. Cl.
| | |
|---|---|
| *G09G 3/32* | (2016.01) |
| *G09G 3/20* | (2006.01) |
| *H01L 21/66* | (2006.01) |
| *H01L 33/50* | (2010.01) |
| *H01L 25/075* | (2006.01) |

(52) U.S. Cl.
CPC ............. *G09G 3/32* (2013.01); *G09G 3/2014* (2013.01); *H01L 22/24* (2013.01); *H01L 33/502* (2013.01); *G09G 3/2003* (2013.01); *G09G 2300/0452* (2013.01); *G09G 2310/0264* (2013.01); *H01L 25/0753* (2013.01); *H01L 2933/0041* (2013.01)

(58) Field of Classification Search
CPC ... H01L 22/24; H01L 33/502; H01L 25/0753; H01L 2933/0041; H05B 33/0818; G09G 3/2014; G09G 3/32; G09G 2300/0452; G09G 2310/0264; G09G 3/2003
See application file for complete search history.

(56) References Cited

U.S. PATENT DOCUMENTS

| | | | |
|---|---|---|---|
| 7,679,626 B2 * | 3/2010 | Mori | H04N 21/4318 345/589 |
| 9,778,586 B2 | 10/2017 | Kinoshita | |
| 10,460,651 B2 * | 10/2019 | Kim | H01L 33/08 |
| 2009/0256797 A1 | 10/2009 | Declercq | |
| 2015/0243206 A1 * | 8/2015 | Kurita | H05B 45/22 250/208.2 |

(Continued)

FOREIGN PATENT DOCUMENTS

| | | |
|---|---|---|
| JP | H 10171401 A | 6/1998 |
| JP | 2005234486 A | 9/2005 |

(Continued)

*Primary Examiner* — Deeprose Subedi
(74) *Attorney, Agent, or Firm* — Nixon Peabody LLP (57) ABSTRACT

Systems and methods to achieve desired color accuracy, power consumption, and gamma correction in an array of pixels of a micro-LED display. The method and system provides an array of pixels, wherein each pixel comprising a plurality of sub-pixels arranged in a matrix and a driving circuitry configured to provide an individual emission control signal to each sub-pixel of each pixel in the array of pixels to independently control an emission time and a duty cycle of each sub-pixel.

20 Claims, 5 Drawing Sheets

(56) References Cited

U.S. PATENT DOCUMENTS

2018/0182279 A1* 6/2018 Sakariya .............. G09G 3/2085

FOREIGN PATENT DOCUMENTS

| | | | |
|---|---|---|---|
| JP | 2012230373 | A | 11/2012 |
| TW | 201633847 | A | 9/2016 |
| WO | 2016196390 | A | 12/2016 |

* cited by examiner

DISPLAY OPTIMIZATION TECHNIQUES FOR MICRO-LED DEVICES AND ARRAYS

CROSS-REFERENCE TO RELATED APPLICATIONS

This application is a continuation of U.S. Nonprovisional application Ser. No. 17/494,399, filed Oct. 5, 2021, now allowed, which is a continuation of U.S. Nonprovisional application Ser. No. 17/015,024, filed Sep. 8, 2020, now U.S. Pat. No. 11,164,512, issued Nov. 2, 2021, which is a continuation of U.S. Nonprovisional application Ser. No. 16/126,444, filed Sep. 10, 2018, abandoned, which claims the benefit of U.S. Provisional Application No. 62/556,608, filed Sep. 11, 2017, each of which is hereby incorporated by reference herein in its entirety.

FIELD OF THE INVENTION

The present disclosure relates generally to micro LED displays and, more particularly, to a micro LED display system and method for improving dynamic range, power consumption and color and gamma correction of the micro LED display.

SUMMARY

Briefly stated, technologies are generally described herein to achieve desired color accuracy, power consumption, and gamma correction in an array of pixels of a micro-LED display. Using the technologies described herein, either the duty cycles or the emission times of sub-pixels arranged in a matrix for each pixel of the micro-LED display may be adjusted to tune the display color without affecting the gamma.

According to one embodiment, a display device may be provided. The display device may include an array of pixels, wherein each pixel may comprising a plurality of subpixels arranged in a matrix. The display device may also include a driving circuitry configured to provide an individual emission control signal to each sub-pixel of each pixel in the array of pixels to independently control an emission time and a duty cycle of each sub-pixel.

According to other embodiment, a method for controlling a pixel circuit of an array of pixel circuits of a display device comprising a plurality of subpixels may include providing an individual emission control signal to each sub-pixel of each pixel in the array of pixel circuits independently to control an emission time and a duty cycle of the sub-pixels.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and additional aspects and embodiments of the present disclosure will be apparent to those of ordinary skill in the art in view of the detailed description of various embodiments and/or aspects, which is made with reference to the drawings, a brief description of which is provided next.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

Color Share and Gamma Adjustment

Unless defined otherwise, all technical and scientific terms used herein have the same meaning as commonly understood by one of ordinary skill in the art to which this invention belongs.

As used in the specification and claims, the singular forms "a", "an" and "the" include plural references unless the context clearly dictates otherwise.

The term "comprising" as used herein will be understood to mean that the list following is non-exhaustive and may or may not include any other additional suitable items, for example one or more further feature(s), component(s) and/or element(s) as appropriate.

In this description, the term "sub-pixel" and "micro device" are used interchangeably. However, it is clear to one skill in the art that the embodiments described here are independent of the device size. Each pixel and sub-pixel used in the description is a light emitting micro-device (Micro-LED).

Micro-LEDs, in general, tend to have a nonlinear current-luminance efficiency (Cd/A) as a function of the drive current. This characteristic may often include a peak of efficiency at a certain current level. A display module may consists an array (active or passive) of pixels. Each pixel itself may comprised of multiple sub-pixels (RGB, RGBW, RGBY, or other combination of color elements, e.g. blue with light conversion). In order to get a target "white-point" ($W_{x,y}$), it may be required to mix certain ratios of the color elements. For instance, for given Red ($R_{x,y}$), Green ($G_{x,y}$), and Blue ($B_{x,y}$) elements, one can use share factors to create the wanted color based on the sum of all the sets, such as $$K_R \cdot R_{x,y} + K_G \cdot G_{x,y} + K_B \cdot B_{x,y} = W_{x,y} \tag{1}$$

where Ki's are the share factors for the tri-color set and x,y are two color coordinates that specify a point on a CIE chromaticity diagram, which represents the mapping of human color perception in terms of the two CIE parameters x and y.

In some applications, it may be required to drive the micro-LEDs at the current level corresponding to the peak efficiency. In this scenario, the desired output luminance level may be achieved using modulation techniques, e.g. Pulse Width Modulation (PWM). Accordingly, a duty-cycle of the emission (EM) control signal will determine the luminance level. However, in order to achieve the desired white-point, one cannot apply the same duty cycle to each of the color elements. The duty-cycle refers to the total amount of time a pulse is 'on' over the duration of the cycle/frame.

Figure 1A:
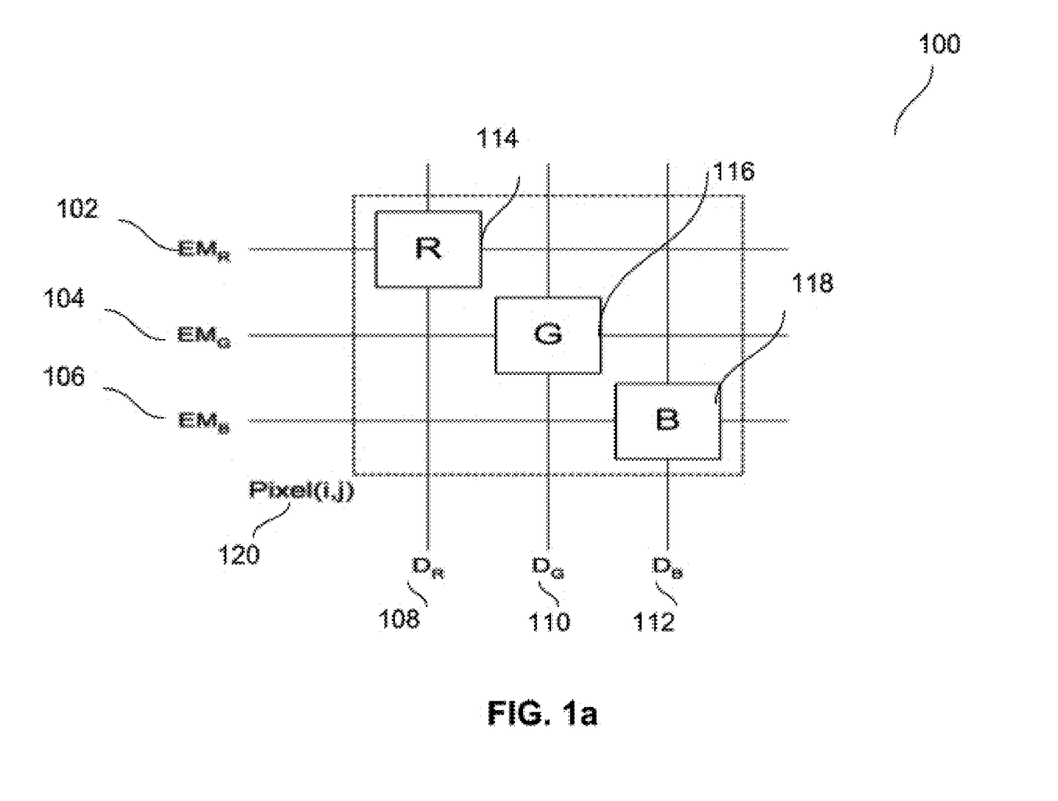
FIG. 1a is a circuit diagram showing individual emission (EM) control signal for sub-pixel elements.

FIG. 1a is a circuit diagram showing individual EM signals for sub-pixel elements. The driving circuitry 100 includes a plurality of emission control signals (102, 104, 106) and a plurality of data lines (108, 110, 112) extending to a pixel 120 having a plurality of sub-pixels elements (114, 116 and 118).

As shown in FIG. 1a, instead of providing combined emission control for each pixel 120, a driving circuitry 100 consisting of three individual EM control signals $EM_R$ 102, $EM_G$ 104, and $EM_B$ 106 for each subpixel (R 114, G 116, B 118) may be provided to facilitate proportional contribution of color elements. The driving circuitry 100 may be configured to provide an individual emission control signal to each sub-pixel of each pixel in the array of pixels to independently control an emission time and a duty cycle of the sub-pixels.

By controlling emission control signals $EM_R$ 102, $EM_G$ 104 and $EM_B$ 106 of sub-pixels rather than pixels, a desired luminance may be achieved. Thus, a first emission control signal e.g. $EM_R$ 102 is provided concurrently to each sub-pixel of a first color in at least one row of pixels, a second emission control signal e.g. $EM_G$ 104 is provided concurrently to each sub-pixel of a second color in at least the one row of pixels, and a third emission control signal e.g. $EM_B$ 106 is provided concurrently to each sub-pixel of a third color in at least the row of pixels. The first color may be provided as red, the second color may be provided as green, and the third color may be provided as blue.

In one embodiment, a fourth emission control signal may be provided to each sub-pixel of a fourth color in at least one row of pixels in the array of pixels, wherein the fourth color is one of cyan, white, and yellow. The emission control signal may be a pulse-width-modulation (PWM) signal.

Figure 1B:
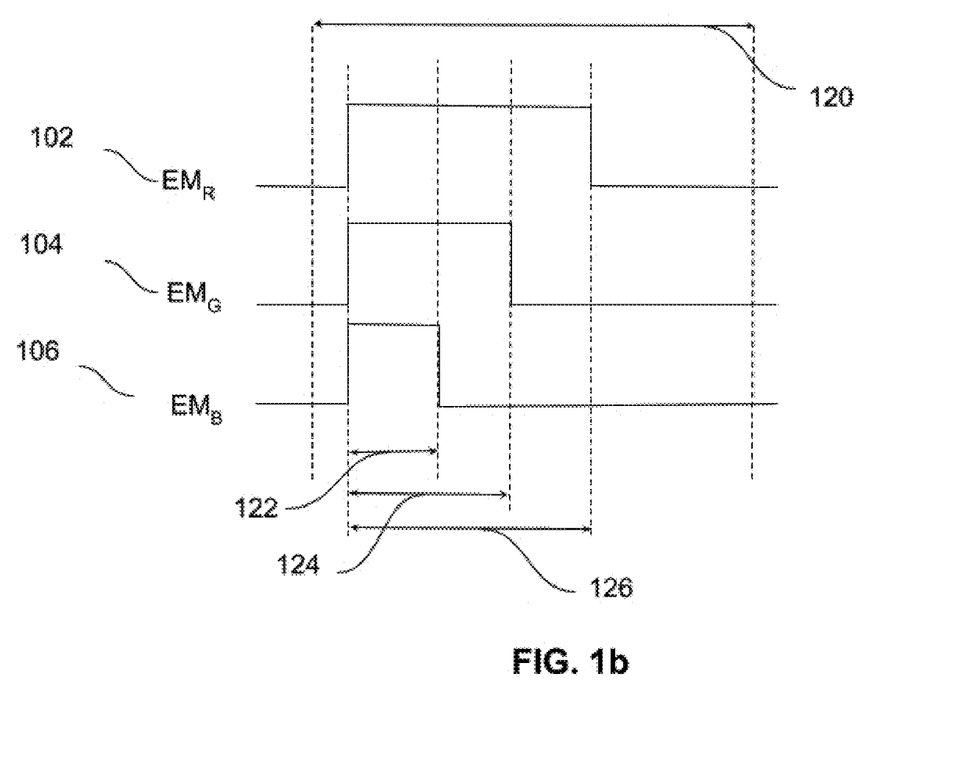
FIG. 1B is a timing diagram illustrating an example of three different emission time created by three individual EM signal.

FIG. 1B is a timing diagram illustrating an example of three different emission time created by three individual EM signals $EM_R$ 102, $EM_G$ 104 and $EM_B$ 106. Here, a frame may start with a off time due to programing or another requirement. Then, the three EM control signals 102, 104, 106 of subpixels are enabled. In one case, all three emission signals may be enabled at the same time, or they may be enabled at different time during a frame time 120. In an example as demonstrated in FIG. 1B, the first color (e.g. red) has longer emission time 126 to operate at its peak efficiency and meeting display requirements. The second color (e.g. green) has a shorter emission time 124 and the third color (e.g. blue) can have a different emission time 122 as well. Despite simplicity, the main challenge with this approach can be the color mixing.

Figure 1C:
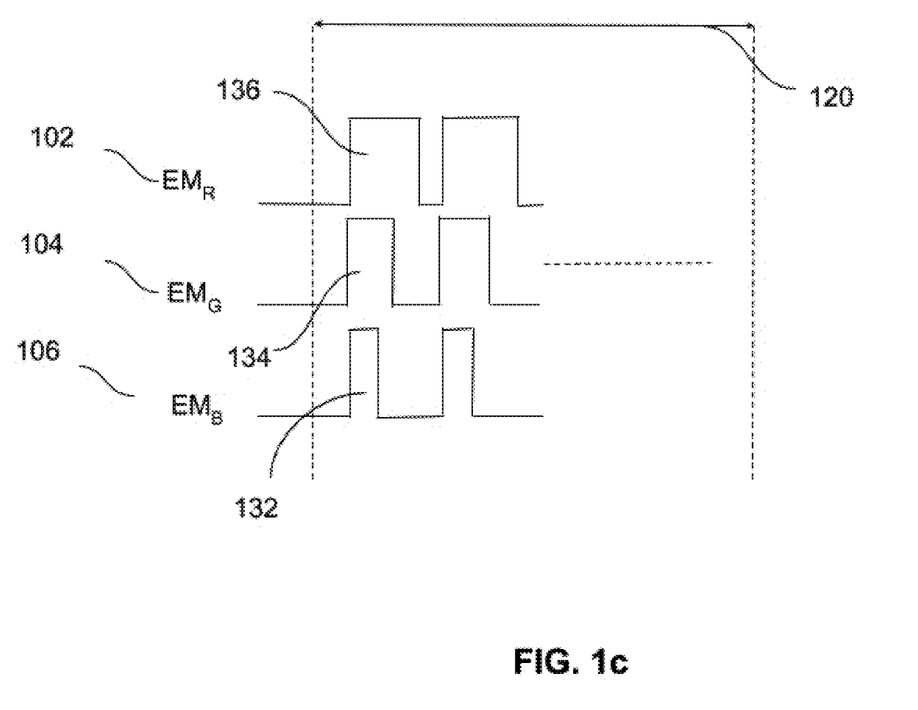
FIG. 1c is a timing diagram illustrating an example of controlling the emission time of each sub-pixel.

To address this challenge, each emission is turned on and off multiple times at different duty cycle during the frame time 120 as demonstrated in FIG. 1c. FIG. 1c is a timing diagram illustrating an example of controlling the emission time of each sub-pixel. As shown in FIG. 1c, different duty cycles 132, 134, and 136 are used for controlling the emission time of each subpixels. Moreover, there can be black frame before or after a combination of few toggles.

Either the duty cycles 132, 134, 136 or the emission times 122, 124, 126 as demonstrated in FIG. 1B and FIG. 1c can be adjusted to tune the display color without affecting the gamma. For example, if for some application, the display needs to have a white point more towards red, the red emission time 122 (or red duty cycle 136) can be increased to provide more red light.

For illustrative purposes, only one pixel 120 is explicitly shown in the FIG. 1a. It is understood that it is not limited to a particular number of rows and columns of pixels. For example, a display system can be implemented with a display screen with a number of rows and columns of pixels commonly available in displays for mobile devices, monitor-based devices, and/or projection-devices. In a multichannel or color display, a number of different types of pixels, each responsible for reproducing color of a particular channel or color such as red, green, or blue, will be present in the display. Pixels of this kind may also be referred to as "subpixels" as a group of them collectively provide a desired color at a particular row and column of the display, which group of subpixels may collectively also be referred to as a "pixel".

Power Optimization and Dynamic Range Enhancement

Displays configured to display a video feed of moving images typically refresh the display at a regular frequency for each frame of the video feed being displayed. Displays incorporating an active matrix can allow individual pixel circuits to be programmed with display information during a program phase and then emit light according to the display information during an emission phase. Thus, displays operate with a duty cycle characterized by the relative durations of the program phase and the emission phase. In addition, the displays operate with a frequency that is characterized by the refresh rate of the display. The refresh rate of the display can also be influenced by the frame rate of the video stream. In such displays, the display can be darkened during program phases while the pixel circuits are receiving programming information. Thus, in some displays, the display is repeatedly darkened and brightened at the refresh rate of the display. A viewer of the display can undesirably perceive that the display is flickering depending on the frequency of the refresh rate.

A frame defines the time period that includes a programming cycle or phase during which each and every pixel in the display system is programmed with a programming voltage indicative of a brightness and a driving or emission cycle or phase during which each light emitting device in each pixel is turned on to emit light at a brightness commensurate with the programming voltage stored in a storage element. A frame is thus one of many still images that compose a complete moving picture displayed on the display system.

There are at least two schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system are programmed first, and all of the pixels are driven at the same time. Either scheme can employ a blanking time at the beginning or end of each frame during which the pixels are not emitting any light.

For emissive displays, the current of the emissive device is controlled by the pixel circuit to create different grayscales during each frame cycle. In one case, the amount of the current is controlled. The main challenge with this method is that some emissive devices (e.g. micro-LEDs) have efficiency curves that drops at lower current and higher current densities. Another method is to control the duration of the current applied to the pixel for each grayscale. There are several issues associated with this approach. However, the main one is the timing. The high resolution and high frame rate displays cannot accommodate the timing needed for this approach.

In one embodiment, the frame timing is adjusted so that the emissive device is working on optimized current density most of the time. For example, if the display is working mainly at a specific brightness, the duty cycles 132, 134, 136 or emission times 122, 124, 126 as shown in FIGS. 1b and 1c can be adjusted so that the emissive device current density is optimized for such brightness. For example, the red emissive device optimized current density can be $J_{r\text{-}opt}$. If the red pixel is on during the entire frame time at such current density, the display can produce brightness $B_{r\text{-}full}$. If the major red brightness is $B_{r\text{-}mj}$, the emissive time 122 can be calculated as $T_f*B_{r\text{-}full}/B_{r\text{-}mj}$ where $T_f$ is the frame time. Similarly, one can calculate the duty cycle 132 for red.

In another embodiment, one method to find the major brightness, is to use the peak brightness and the applications. For example, videos are mainly running at 30% of peak brightness.

In yet another embodiment, another method to find the optimize duty cycles 132, 134, 136 and emission times 122, 124, 126 is to evaluate the frame data to find the optimized duty cycle. In one case, the major brightness is calculated for the frame to find the proper value for the duty cycles or emission times. In another method, an optimization algorithm is run to find a global or a local optimized value for the duty cycles or the emission times. The same method can be used for multiple frames instead of one frame.

In another method, the frame can be divided into several sub frames and the emission times or the duty cycles that are optimized for each sub frames for a power consumption of different ranges of gray scales. These optimizations can be done similar to the one done for a single sub frame.

Figure 2A:
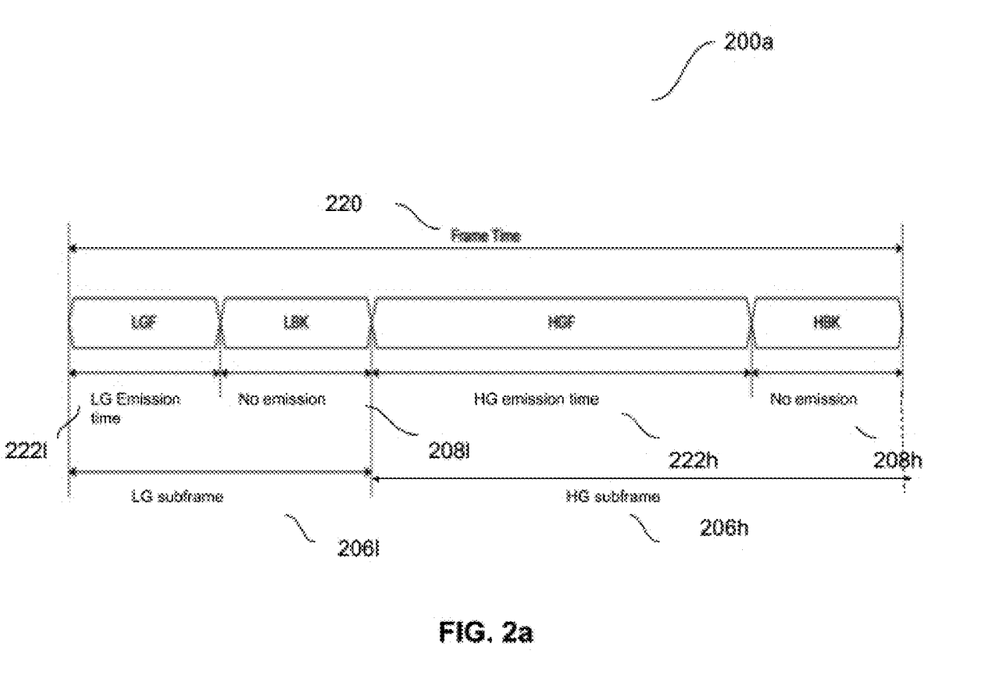
FIG. 2a-2b diagrammatic illustrations of a power optimized display driving scheme.
Figure 2B:
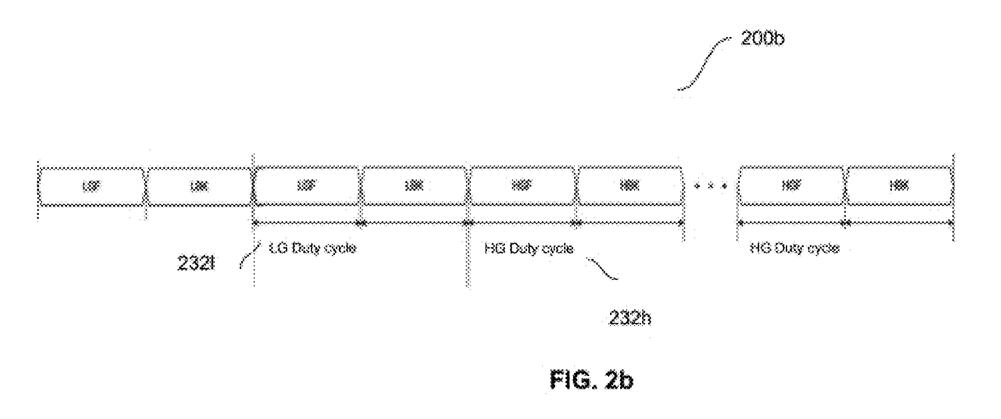

FIG. 2a-2b depicts two examples of power optimized display driving scheme. A panel driving scheme comprises plurality of sub-frame cycles in which at least one gray-scale level may be optimized to achieve lower power consumption.

In the driving scheme of FIG. 2a, a panel driving scheme 200a comprises a frame having a plurality of sub-frame cycles such as low grayscale emission time 222l and no emission 208l for low grayscale subframe 206l and high grayscale emission time 222h and no emission 208h for high grayscale subframe 206h during a frame time 220. As illustrated in FIG. 2a, the emission time 222l, 222h optimization for both low and high grayscale ranges is used. Every row of the display array is accessed only twice during each frame time 220 to refresh the pixel contents within that row according to the optimized video data. The row access interval may be separated by one or more row times. Accordingly, in this driving scheme, the memory buffer depth requirement may be limited to the number of rows between two consecutive access intervals.

In the driving scheme 200b of FIG. 2b, the duty cycle optimization is used. Here, the duty cycle 232l and 232h is optimized for two range of grayscales (e.g. low and high) to achieve the lowest power consumption.

According to some examples, a display device may be provided. The display device may comprising an array of pixels, wherein each pixel comprising a plurality of subpixels arranged in a matrix and a driving circuitry configured to provide an individual emission control signal to each sub-pixel of each pixel in the array of pixels to independently control a emission time and a duty cycle of each sub-pixel.

According to another embodiments, the display may further include a first emission control signal may be provided concurrently to each sub-pixel of a first color in at least one row of pixels, a second emission control signal may be provided concurrently to each sub-pixel of a second color in at least the one row of pixels, and a third emission control signal may be provided concurrently to each sub-pixel of a third color in at least the row of pixels. The first color may be red, the second color may be green, and the third color may be blue.

Another to some embodiments, the display may further comprising a fourth emission control signal may be provided to each sub-pixel of a fourth color in the array of pixels, wherein the fourth color is one of cyan, white, and yellow.

According to further embodiments, the emission control signal may be a pulse-width-modulation (PWM) signal and each pixel and sub-pixel may be a micro-light emitting device (LED).

According to yet further embodiments, the first, second and third emission control signals may be enabled at a same time or a different time during a frame time. The first, second and third emission control signals may turned on and off multiple times at different duty cycle during the frame time.

According to further examples, the emission time or the duty cycle for each sub-pixel may dynamically adjusted to tune the display device color and optimize power consumption.

According to some embodiments, a frame data may be evaluated to find the optimized duty cycle and the emission time. An optimization algorithm may be employed to calculate a global or a local optimized value for the duty cycle or the emission time for each sub-pixel. The duty cycle may be optimized for two range of grayscales to achieve the lowest power consumption.

According to other embodiments, a method for controlling a pixel circuit of an array of pixel circuits of a display device, the pixel circuit comprising a plurality of subpixels may include providing an individual emission control signal to each sub-pixel of each pixel in the array of pixel circuits independently to control an emission time and a duty cycle of the sub-pixels.

According to some embodiments, the emission time or the duty cycle for each sub-pixel may dynamically adjusted to tune the display device color and optimize power consumption.

According to another embodiments, a frame data may evaluated to find the optimized duty cycle and the emission time. an optimization algorithm may be employed to calculate a global or a local optimized value for the duty cycle or the emission time for each sub-pixel. The duty cycle may optimized for two range of grayscales to achieve the lowest power consumption.

According to yet other embodiments, the emission control signal may be a pulse-width-modulation (PWM) signal. Each pixel and sub-pixel is a micro-light emitting device (LED).

According to some other embodiments, the method may further comprising providing a first emission control signal concurrently to each sub-pixel of a first color in at least one row of pixels, providing a second emission control signal concurrently to each sub-pixel of a second color in at least the one row of pixels; and providing a third emission control signal concurrently to each sub-pixel of a third color in at least the row of pixels.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

I claim:

1. A display device comprising:
   an array of pixels, wherein each pixel includes a plurality of sub-pixels arranged in a matrix; and a driving circuitry configured to provide an individual emission control signal to each sub-pixel of each pixel in the array of pixels to independently control an emission time and a duty cycle of each sub-pixel, the emission time of said each sub-pixel is $T_f*B_{full}/B_{mj}$, wherein $T_f$ is a frame time of a frame, $B_{full}$ is a brightness of the display device when said each sub-pixel is on an optimized current density during the frame time, and $B_{mj}$ is a major brightness during frame time;

wherein each row of the array of pixels is accessed twice during the frame time, the frame includes a first subframe and a second subframe following the first subframe, the first subframe is divided into a first emission time period and no emission time period following the first emission time period, and the second subframe is divided into a second emission time period and no emission time period following the second emission time period;

wherein the first emission time period is indicative of a first grayscale, the second emission time period is indicative of a second grayscale, the second grayscale is higher than the first grayscale.

2. The display device, wherein a first emission control signal is provided concurrently to each sub-pixel of a first color in at least one row of pixels, a second emission control signal is provided concurrently to each sub-pixel of a second color in at least the one row of pixels, and a third emission control signal is provided concurrently to each sub-pixel of a third color in at least the row of pixels.

3. The display device as claimed in claim 2, wherein the first color is red, the second color is green, and the third color is blue.

4. The display device as claimed in claim 2, wherein a fourth emission control signal is provided to each sub-pixel of a fourth color in the array of pixels, wherein the fourth color is one of cyan, white, and yellow.

5. The display device as claimed in claim 1, wherein the emission control signal is a pulse-width-modulation (PWM) signal.

6. The display device as claimed in claim 1, wherein each pixel and sub-pixel is a micro-light emitting device (LED).

7. The display device as claimed in claim 2, wherein the first, second and third emission control signals are enabled at a same time or a different time during a frame time.

8. The display device as claimed in claim 6, wherein the first, second and third emission control signals are turned on and off multiple times at different duty cycle during the frame time.

9. The display device as claimed in claim 1, wherein the emission time or the duty cycle for each sub-pixel is dynamically adjusted to tune the display device color and optimize power consumption.

10. The display device of claim 1, wherein a frame data is evaluated to find the optimized duty cycle and the emission time.

11. The display device of claim 1, wherein an optimization algorithm is employed to calculate a global or a local optimized value for the duty cycle or the emission time for each sub-pixel.

12. The display device as claimed in claim 9, wherein the duty cycle is optimized for two range of grayscales to achieve the lowest power consumption.

13. A method for controlling a pixel circuit of an array of pixel circuits of a display device, the pixel circuit comprising a plurality of subpixels, the method comprising:

providing an individual emission control signal to each sub-pixel of each pixel in the array of pixel circuits independently to control an emission time and a duty cycle of the sub-pixels, the emission time of said each sub-pixel is $T_f*B_{full}/B_{mj}$, wherein $T_f$ is a frame time of a frame, $B_{full}$ is a brightness of the display device when said each sub-pixel is on at an optimized current density during the frame time and $B_{mj}$ is the major brightness during frame time, accessing each row of the array of pixel circuits twice during the frame time, wherein the frame includes a first subframe and a second subframe following the first subframe, the first subframe is divided into a first emission time period and no emission time period following the first emission time period, and the second subframe is divided into a second emission time period and no emission time period following the second emission time period;

wherein the first emission time period is indicative of a first grayscale, the second emission time period is indicative of a second grayscale, the second grayscale is higher than the first grayscale.

14. The method as claimed in claim 13, wherein the emission time or the duty cycle for each sub-pixel is dynamically adjusted to tune the display device color and optimize power consumption.

15. The method as claimed in claim 13, wherein a frame data is evaluated to find the optimized duty cycle and the emission time.

16. The method as claimed in claim 13, wherein an optimization algorithm is employed to calculate a global or a local optimized value for the duty cycle or the emission time for each sub-pixel.

17. The method as claimed in claim 13, wherein the duty cycle is optimized for two range of grayscales to achieve the lowest power consumption.

18. The method as claimed in claim 13, wherein the emission control signal is a pulse-width-modulation (PWM) signal.

19. The method as claimed in claim 13, wherein each pixel and sub-pixel is a micro-light emitting device (LED).

20. The method as claimed in claim 13, further comprising:
providing a first emission control signal concurrently to each sub-pixel of a first color in at least one row of pixels;
providing a second emission control signal concurrently to each sub-pixel of a second color in at least the one row of pixels; and
providing a third emission control signal concurrently to each sub-pixel of a third color in at least the row of pixels.

* * * * *